United States Patent
Suzuki

(10) Patent No.: US 10,921,359 B2
(45) Date of Patent: Feb. 16, 2021

(54) IMPEDANCE MEASURING SEMICONDUCTOR CIRCUIT

(71) Applicant: RENESAS ELECTRONICS CORPORATION, Tokyo (JP)

(72) Inventor: Hiroto Suzuki, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 74 days.

(21) Appl. No.: 16/247,036

(22) Filed: Jan. 14, 2019

(65) Prior Publication Data

US 2019/0250197 A1 Aug. 15, 2019

(30) Foreign Application Priority Data

Feb. 9, 2018 (JP) .................................. 2018-021864

(51) Int. Cl.
 *G01R 31/00* (2006.01)
 *G01R 27/26* (2006.01)
 *H03F 3/45* (2006.01)

(52) U.S. Cl.
 CPC ......... *G01R 27/26* (2013.01); *H03F 3/45071* (2013.01); *H03F 3/45475* (2013.01); *H03F 2200/129* (2013.01); *H03F 2200/156* (2013.01); *H03F 2200/228* (2013.01); *H03F 2200/231* (2013.01); *H03F 2200/261* (2013.01); *H03F 2203/45514* (2013.01); *H03F 2203/45526* (2013.01); *H03F 2203/45528* (2013.01); *H03F 2203/45534* (2013.01)

(58) Field of Classification Search
 CPC ..... G01R 27/26; G01R 27/02; H03F 3/45475; H03F 3/45071; H03F 2200/261; H03F 2200/231; H03F 2200/228; H03F 2200/129
 See application file for complete search history.

(56) References Cited

U.S. PATENT DOCUMENTS

| 5,917,346 | A | 6/1999 | Gord |
| 9,831,842 | B2* | 11/2017 | Kiritani ..................... H03F 3/08 |
| 2008/0136441 | A1* | 6/2008 | Terauchi .......... G01R 31/31706 326/16 |

FOREIGN PATENT DOCUMENTS

JP 2016-072923 A 5/2016

* cited by examiner

*Primary Examiner* — Dominic E Hawkins
(74) *Attorney, Agent, or Firm* — McDermott Will & Emery LLP

(57) ABSTRACT

A provided impedance measuring semiconductor circuit can suppress the influence of sensors on the measurements of other sensors in the measurements of the sensors. According to an embodiment, an impedance measuring semiconductor circuit includes a first resistance element, an operational amplifier having a positive input terminal and an output terminal, the positive input terminal receiving a predetermined set voltage, the output terminal being coupled to one end of the first resistance element, a first output-side switch that electrically couples or decouples a first sensor and the other end of the first resistance element, a second output-side switch that electrically couples or decouples a second sensor and the other end of the first resistance element, a first input-side switch that electrically couples or decouples the first sensor and a negative input terminal, and a second input-side switch that electrically couples or decouples the second sensor and the negative input terminal.

20 Claims, 11 Drawing Sheets

IMPEDANCE MEASURING SEMICONDUCTOR CIRCUIT

CROSS-REFERENCE TO RELATED APPLICATIONS

The disclosure of Japanese Patent Application No. 2018-021864 filed on Feb. 9, 2018 including the specification, drawings and abstract is incorporated herein by reference in its entirety.

BACKGROUND

The present invention relates to an impedance measuring semiconductor circuit and relates to, for example, a semiconductor circuit for measuring the impedance of a sensor coupled to a measuring object.

Japanese Unexamined Patent Application Publication No. 2016-072923 describes a semiconductor circuit intended to reduce the on resistance and the ESD resistance of an analog switch and accurately perform an amplifying operation.

SUMMARY

In a semiconductor circuit including a plurality of sensors coupled to a measuring object, when a current is measured by each of the sensors by switching of analog switches, the sensor in the measurement may be affected by currents applied to the other sensors.

Other problems and new features will be clarified by the description and the accompanying drawings of the present specification.

According to an embodiment, an impedance measuring semiconductor circuit for measuring the impedances of a first sensor and a second sensor, the impedance measuring semiconductor circuit including a first resistance element having one end and the other end, an operational amplifier that includes a positive input terminal, a negative input terminal, and an output terminal, the positive input terminal receiving a predetermined set voltage, the output terminal being coupled to one end of the first resistance element, a first output-side switch coupled so as to electrically couple or decouple the first sensor and the other end of the first resistance element, a second output-side switch coupled so as to electrically couple or decouple the second sensor and the other end of the first resistance element, a first input-side switch coupled so as to electrically couple or decouple the first sensor and the negative input terminal, and a second input-side switch coupled so as to electrically couple or decouple the second sensor and the negative input terminal.

The embodiment can provide an impedance measuring semiconductor circuit that can suppress the influence of sensors on the measurements of other sensors.

DETAILED DESCRIPTION

Figure 1:
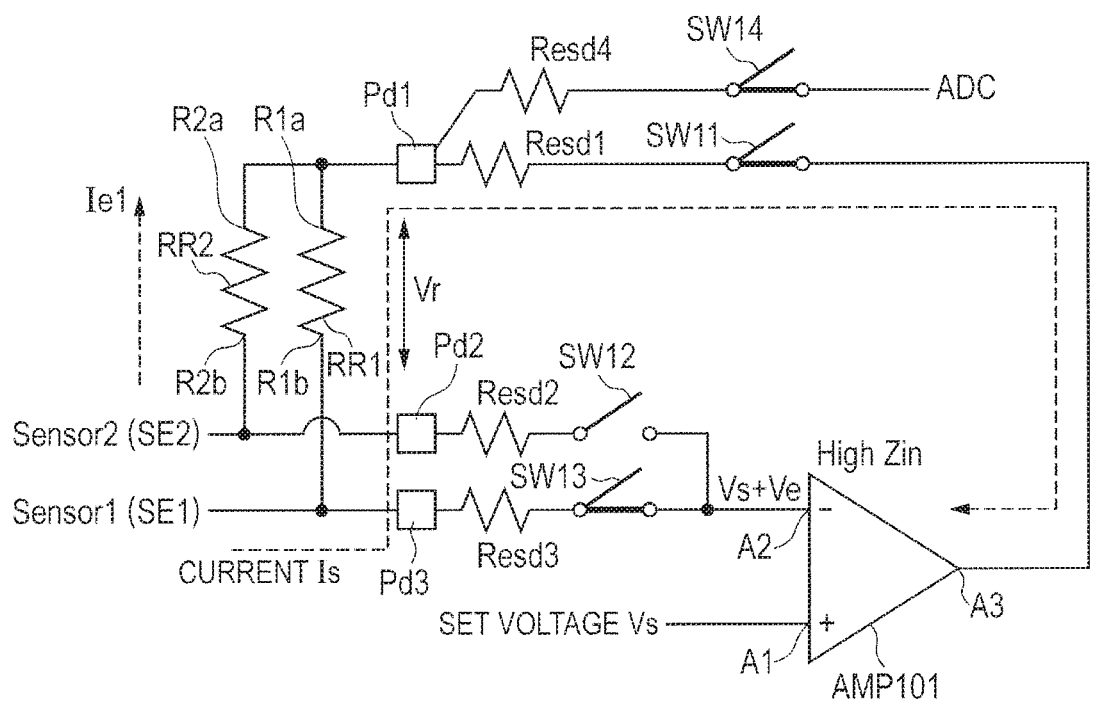
FIG. 1 is a circuit diagram illustrating the configuration of an impedance measuring semiconductor circuit according to a comparative example.

For clarification of the explanation, the following description and drawings are optionally omitted and simplified. The same elements are indicated by the same reference numerals in the drawings and the redundant explanation is optionally omitted.

First, a measurement error of an impedance measuring semiconductor circuit devised by the inventors will be described below with reference to a comparative example. This will further clarify impedance measuring semiconductor circuits according to embodiments.

Comparative Example

The configuration of the impedance measuring semiconductor circuit according to the comparative example will be first described below. FIG. 1 is a circuit diagram illustrating the configuration the impedance measuring semiconductor circuit according to the comparative example. As shown in FIG. 1, an impedance measuring semiconductor circuit 101 according to the comparative example includes an operational amplifier AMP101, a resistance element RR1, a resistance element RR2, and a plurality of switches SW11 to SW14.

The operational amplifier AMP101 includes a positive input terminal A1, a negative input terminal A2, and an output terminal A3. The positive input terminal A1 of the operational amplifier AMP101 receives a predetermined set voltage Vs.

The resistance element RR1 has one end R1a and the other end R1b. The resistance element RR2 has one end R2a and the other end R2b. One end R1a of the resistance element RR1 and one end R2a of the resistance element RR2 are coupled to the output terminal A3 of the operational amplifier AMP101 via the switch SW11. Thus, the switch SW11 electrically couples or decouples one end R1a of the resistance element RR1 and one end R2a of the resistance element RR2 to and from the output terminal A3 of the operational amplifier AMP101. Furthermore, a pad Pd1 may be provided between one end R1a of the resistance element RR1 and one end R2a of the resistance element RR2 and the switch SW11.

One end R1a of the resistance element RR1 and one end R2a of the resistance element RR2 are coupled to an analog-to-digital converter circuit (Hereinafter, will be referred to as an ADC) via the switch SW14. Thus, the switch SW14 electrically couples or decouples one end R1a of the resistance element RR1 and the one end R2a of the resistance element RR2 to and from the ADC. Furthermore, the pad Pd1 may be provided between one end R1a of the resistance element RR1 and one end R2a of the resistance element RR2 and the switch SW14.

The other end Rib of the resistance element RR1 is coupled to a first sensor SE1. The other end R2b of the resistance element RR2 is coupled to a second sensor SE2. The sensor SE1 is coupled to the negative input terminal A2 of the operational amplifier AMP101 via the switch SW13. Thus, the switch SW13 electrically couples or decouples the sensor SE1 and the negative input terminal A2 of the operational amplifier AMP101. The sensor SE2 is coupled to the negative input terminal A2 of the operational amplifier AMP101 via the switch SW12. Thus, the switch SW12 electrically couples or decouples the sensor SE2 and the negative input terminal A2 of the operational amplifier AMP101. Furthermore, a pad Pd3 may be provided between the sensor SE1 and the switch SW13. A pad Pd2 may be provided between the sensor SE2 and the switch SW12. The switches SW11 to SW14 are, for example, analog switches.

The impedance measuring semiconductor circuit 101 of the comparative example includes the negative feedback circuit of the operational amplifier AMP101 that is coupled to the sensor SE1 and the sensor SE2. A current passing through the sensor SE1 and the sensor SE2 that are coupled to a measuring object is converted into a voltage, and the voltage is measured.

Three factors of a measurement error in the impedance measuring semiconductor circuit 101 according to the comparative example will be described below.

The first factor is the indirect influence of a current passing through the other sensor. The measurement of a current passing through the sensor SE1 may be indirectly affected by a current passing through the sensor SE2, causing a measurement error of the sensor SE1. Specifically, the operational amplifier AMP101 has a high input impedance and a current from the sensor flows into or out of the output of the operational amplifier having a low output impedance. Thus, a current larger than the allowable output current of the operational amplifier AMP101 may flow into or out of the sensor SE2. In this case, the operating point of a transistor in the operational amplifier AMP101 falls outside a normal range. This reduces the gain of the operational amplifier AMP101. Thus, a displacement may occur from the virtual ground of the negative feedback circuit of the operational amplifier AMP101 so as to deviate the voltage of the sensor SE1 from the set voltage Vs. For example, the voltage of the sensor SE1 reaches the set voltage Vs+Ve. The voltage Ve is an error caused by the influence of the sensor SE2. In this way, the measurement error of the sensor SE1 occurs.

A voltage Vadc inputted from the sensor SE1 to the ADC is expressed by equation (1) below:

$$Vadc = Is \cdot R1 = \{(Vs \pm Ve)/Rs\} \cdot R1 = (Vs/Rs) \cdot R1 \pm (Ve/Rs) \cdot R1 \quad (1)$$

where R1 is the resistance of the resistance element RR1, Is is a current passing through the sensor SE1, and Rs is the impedance of the sensor SE1. The second term of equation (1) is an error.

The second factor is the influence of noise of the other sensor. The influence of noise outside the frequency band of the negative feedback circuit may cause a measurement error. For example, the voltage Vadc inputted from the sensor SE1 to the ADC is expressed by equation (2) below:

$$Vadc = \{RA\}/\{RA+R2\} \cdot Vn \quad (2)$$

where RA is the parallel resistance of Ramp and (R1+Rs) and Vn is a noise voltage generated from the sensor SE2. Ramp is an output impedance outside the band of the operational amplifier AMP101 and Rs is the impedance of the sensor SE1. However, it is assumed that the on resistances of EST resistors Resd 1 to Resd4 and the switches SW11 to SW14 are low enough to be negligible.

In this case, the voltage Vadc inputted from the sensor SE1 to the ADC includes the noise voltage Vn generated from the sensor SE2.

Figure 2:
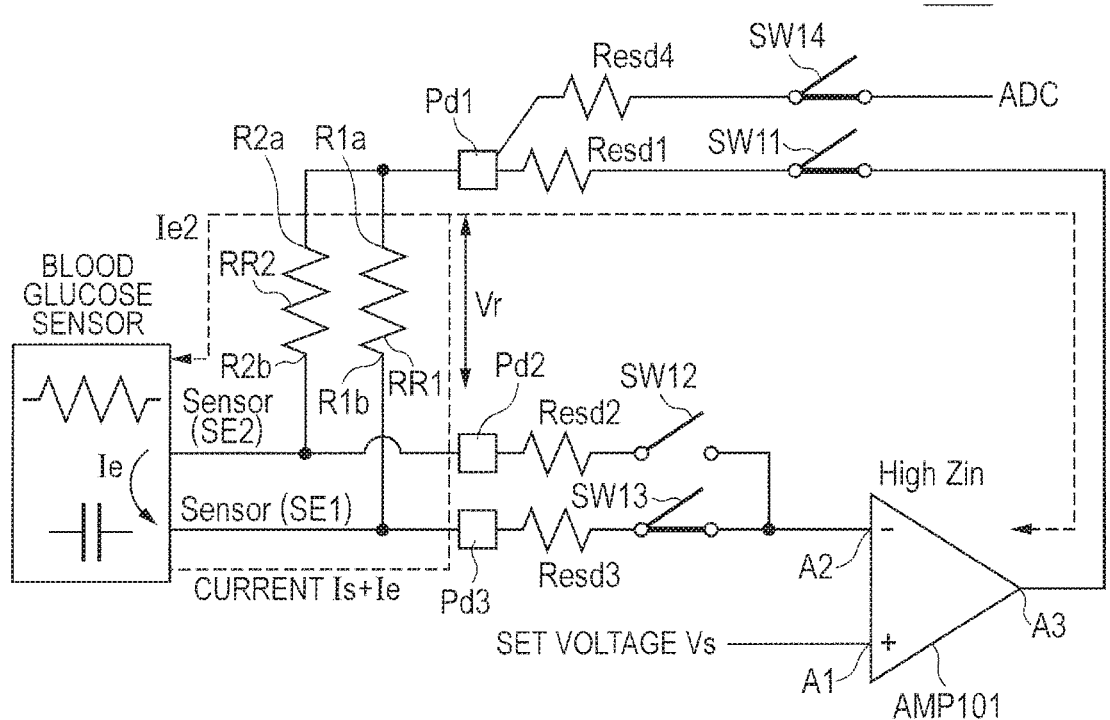
FIG. 2 is a circuit diagram illustrating the configuration of an impedance measuring semiconductor circuit according to another comparative example.

The third factor is the direct influence of a current passing through the other sensor. If the sensor SE1 and the sensor SE2 are physically coupled to each other via a resistor or a capacitor, for example, in a measurement of a single sensor with a plurality of electrodes, a current Ie2 passing through the sensor SE2 directly affects the current value of the sensor SE1. This causes an error of current measurement. FIG. 2 is a circuit diagram illustrating the configuration of an impedance measuring semiconductor circuit 101a according to another comparative example. As shown in FIG. 2, for example, in a measurement of the sensor SE1, the sensor SE1 is physically coupled to another sensor, e.g., the sensor SE2 via a resistor or a capacitor in a blood glucose sensor. Thus, the current Ie2 flowing into the sensor SE2 directly affects the sensor SE1. This causes an error of current measurement of the sensor SE1.

As described above, in the comparative examples, the sensors are not isolated from the impedance measuring semiconductor circuit. The sensor during a measurement is affected by the other sensor. This does not allow accurate measurement, resulting in a measurement error.

First Embodiment

Figure 3:
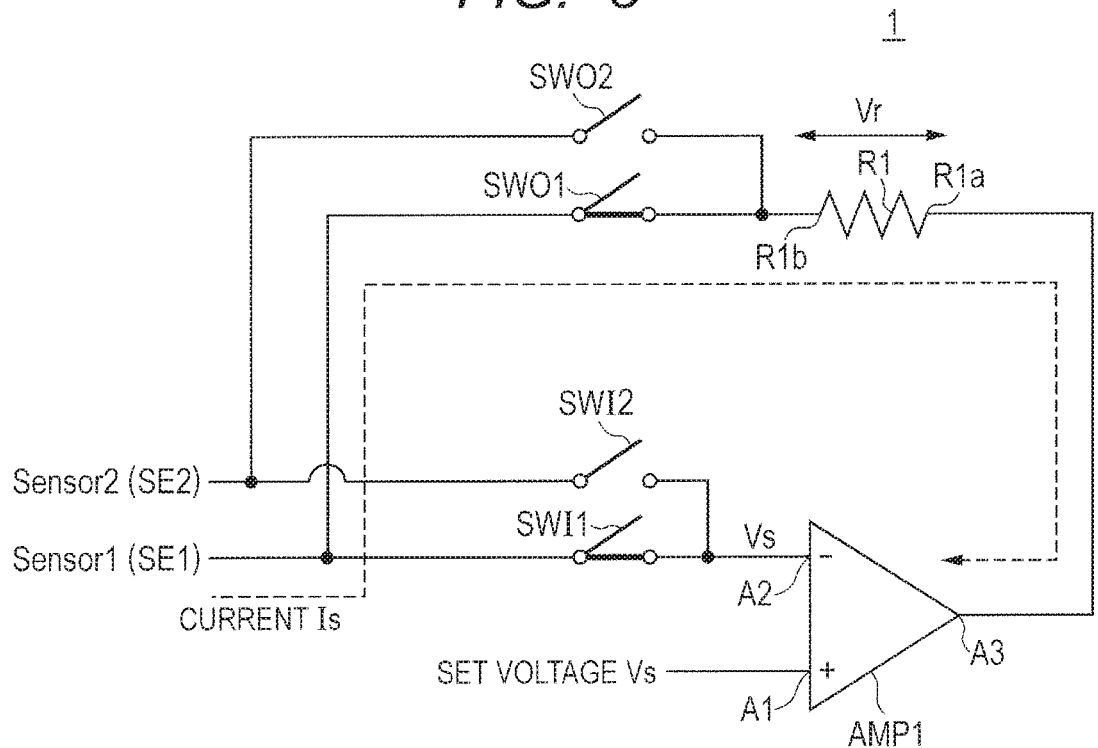
FIG. 3 is a circuit diagram illustrating the configuration of the impedance measuring semiconductor circuit according to a first embodiment.

An impedance measuring semiconductor circuit according to a first embodiment will be described below. FIG. 3 is a circuit diagram illustrating the configuration of the impedance measuring semiconductor circuit according to the first embodiment. As shown in FIG. 3, an impedance measuring semiconductor circuit 1 according to the present embodiment includes an operational amplifier AMP1, a first resistance element R1, a first output-side switch SWO1, a second output-side switch SWO2, a first input-side switch SWI1, and a second input-side switch SWI2. The switches are, for example, analog switches.

The impedance measuring semiconductor circuit 1 of the first embodiment is a current-to-voltage converter circuit including a plurality of analog switches in a negative feedback loop including the operational amplifier AMP1. The impedance measuring semiconductor circuit 1 of the present embodiment measures the impedances of a first sensor SE1 and a second sensor SE2 that are coupled to a measuring object.

The operational amplifier AMP1 includes a positive input terminal A1, a negative input terminal A2, and an output terminal A3. The positive input terminal A1 receives a predetermined set voltage Vs. Thus, the voltage of the positive input terminal A1 is set at the set voltage Vs. The set voltage Vs may be, for example, a reference voltage Vref, a digital-to-analog converter circuit (DAC), a DC voltage such as a ground voltage, or an AC voltage such as a sinusoidal voltage.

The first resistance element R1 has one end R1a and the other end R1b. One end R1a of the first resistance element R1 is coupled to the output terminal A3 of the operational amplifier AMP1. The other end R1b of the first resistance element R1 is coupled to the first sensor SE1 via the first output-side switch SWO1. The first resistance element R1 has a predetermined resistance value. A voltage between the one end R1a and the other end R1b of the first resistance element R1 can be measured according to the value of current passing through the first resistance element R1.

The first output-side switch SWO1 is coupled between the first sensor SE1 and the other end R1b of the first resistance element R1. Specifically, the first output-side switch SWO1 is provided between wires coupling the first sensor SE1 and the other end R1b of the first resistance element R1. The first output-side switch SWO1 is coupled so as to electrically couple or decouple the first sensor SE1 and the other end R1b of the first resistance element R1.

The second output-side switch SWO2 is coupled between the second sensor SE2 and the other end R1b of the first resistance element R1. Specifically, the second output-side switch SWO2 is provided between wires coupling the second sensor SE2 and the other end R1b of the first resistance element R1. The second output-side switch SWO2 is coupled so as to electrically couple or decouple the second sensor SE2 and the other end R1b of the first resistance element R1.

The first output-side switch SWO1 is coupled between the first sensor SE1 and the negative input terminal A2 of the operational amplifier AMP1. Specifically, the first input-side switch SWI1 is provided between wires coupling the first sensor SE1 and the negative input terminal A2 of the operational amplifier AMP1. The first input-side switch SWI1 is coupled so as to electrically couple or decouple the first sensor SE1 and the negative input terminal A2 of the operational amplifier AMP1.

The second input-side switch SWI2 is coupled between the second sensor SE2 and the negative input terminal A2 of the operational amplifier AMP1. Specifically, the second input-side switch SWI2 is provided between wires coupling the second sensor SE2 and the negative input terminal A2 of the operational amplifier AMP1. The second input-side switch SWI2 is coupled so as to electrically couple or decouple the second sensor SE2 and the negative input terminal A2 of the operational amplifier AMP1.

A method of measuring a current passing through the first sensor SE1 and the second sensor SE2 will be discussed below as an operation of the impedance measuring semiconductor circuit 1 of the present embodiment.

First, the analog switches coupled to the first sensor SE1, that is, the first output-side switch SWO1 and the first input-side switch SWI1 are turned on. This couples the output terminal A3 of the operational amplifier AMP1 to the first resistance element R1 and the first sensor SE1. Moreover, the negative input terminal A2 of the operational amplifier AMP1 is coupled to the first sensor SE1. This forms the negative feedback loop of the operational amplifier AMP1. Thus, a voltage applied to the first sensor SE1 can be equal to the set voltage Vs of the positive input terminal A1. In this way, the first output-side switch SWO1 and the first input-side switch SWI1 are turned on and the second output-side switch SWO2 and the second input-side switch SWI2 are turned off.

A current Is passing through the first sensor SE1 and an impedance Zs of the first sensor SE1 are determined as follows: A voltage Vr across the first resistance element R1 is expressed by equation (3) below:

$$Vr = R1 \cdot Is \quad (3)$$

where R1 is the resistance of the first resistance element R1. Thus, by measuring the voltage Vr across the first resistance element R1 by means of an ADC or the like, the current Is can be determined according to equation (4) below:

$$Is = Vr/R1 \quad (4)$$

The impedance Zs is expressed by equation (5) below:

$$Zs = Vs/Is \quad (5)$$

Thus, the impedance Zs can be determined from equation (4) according to equation (6) below:

$$Zs = Vs/(Vr/R1) \quad (6)$$

The impedance Zs at a frequency f is determined according to equation (7) below:

$$Vs(t) = Vm \cdot \sin(2 \cdot \pi \cdot f \cdot t) \quad (7)$$

where Vm is an amplitude applied to the first sensor SE1. Thus, according to equation (8) below, the impedance Zs is determined by equation (9) below:

$$Is(t) = Vr(t)/R1 \quad (8)$$

$$Zs = Vs(t)/(Vr(t)/R1) = Vs(t)/Vr(t) \cdot R1 \quad (9)$$

The amplitude and the phase of the impedance Zs are values at the frequency f. The current Is passing through the second sensor SE2 and the impedance Zs of the second sensor SE2 are measured as in the measurement of the first sensor SE1. In this case, the second output-side switch SWO2 and the second input-side switch SWI2 are turned on and the first output-side switch SWO1 and the first input-side switch SWI1 are turned off.

The effect of the present embodiment will be described below.

The impedance measuring semiconductor circuit 1 according to the present embodiment includes the analog switches (the first output-side switch SWO1, the second output-side switch SWO2, the first input-side switch SWI1, and the second input-side switch SWI2) in the negative feedback loop including the operational amplifier AMP1.

Thus, the equations for measuring the current Is and the impedance Zs do not include the on resistances of the analog switches. This can suppress the influence of the on resistances of the analog switches on the measurement of the current Is and the measurement of the impedance Zs.

Moreover, as shown in FIG. 3, the first sensor SE1 and the second sensor SE2 are isolated by the analog switches. Specifically, at the time of measurement with the first sensor SE1, the first output-side switch SWO1 and the first input-side switch SWI1 are turned on, whereas the second output-side switch SWO2 and the second input-side switch SWI2 are turned off. At the time of measurement with the second sensor SE2, the sensors are reversely turned on and off. Thus, in measurements with the first sensor SE1 and the second sensor SE2, the influence of the other sensor can be suppressed, achieving accurate measurements.

By integrating current values obtained in the measurement of the current Is, the sensors can be also used as blood glucose monitors.

(Modification)

Figure 4:
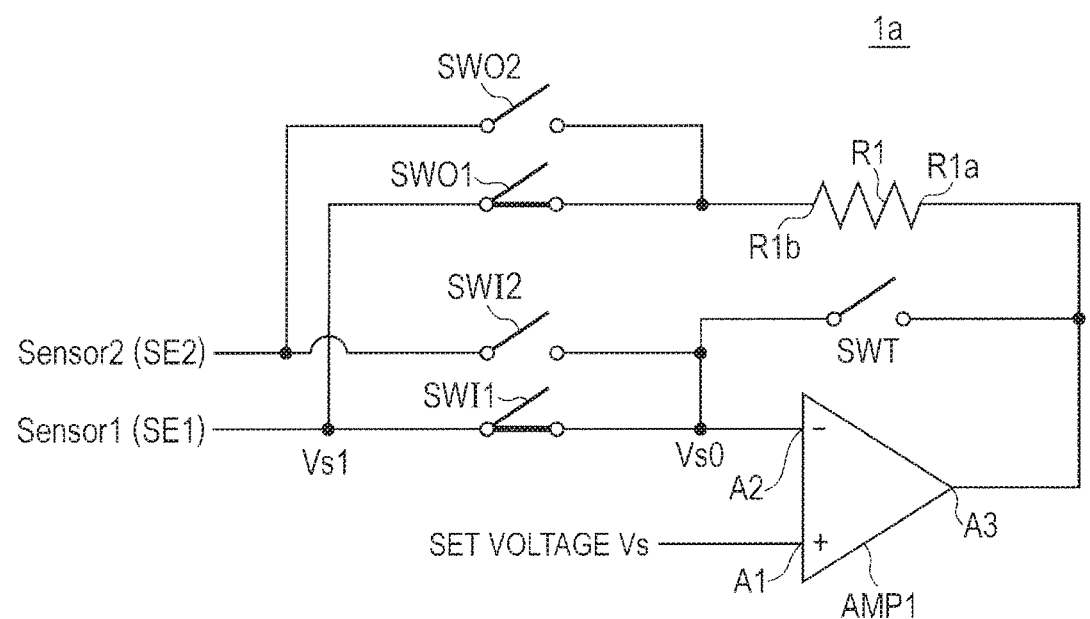
FIG. 4 is a circuit diagram illustrating the configuration of an impedance measuring semiconductor circuit according to a modification of the first embodiment.

A modification of the first embodiment will be described below. FIG. 4 is a circuit diagram illustrating the configuration of an impedance measuring semiconductor circuit according to the modification of the first embodiment. As shown in FIG. 4, an impedance measuring semiconductor circuit 1a of the modification includes an on-off switch SWT.

The on-off switch SWT is coupled between one end R1a of a first resistance element R1 and a negative input terminal A2 of an operational amplifier AMP1. Specifically, the on-off switch SWT is provided between wires coupling one end R1a of the first resistance element R1 and a negative input terminal A2 of the operational amplifier AMP1. The on-off switch SWT is coupled so as to electrically couple or decouple one end R1a of the first resistance element R1 and the negative input terminal A2 of the operational amplifier AMP1. Other configurations are similar to those of the first embodiment.

Figure 5:
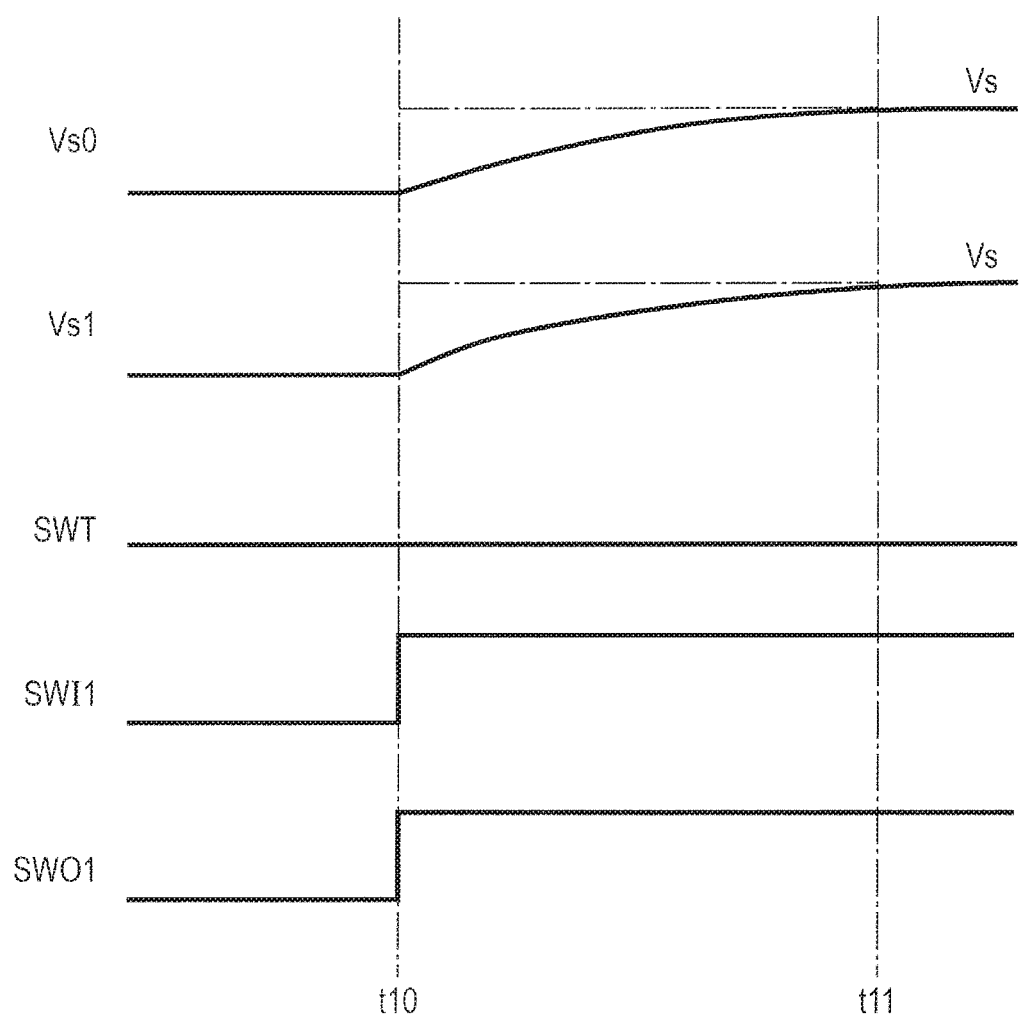
FIG. 5 is a graph showing a voltage between a first input-side switch and an operational amplifier and a voltage between the first input-side switch and a first sensor and the on/off operations of an on-off switch, the first input-side switch, and a first output-side switch in the impedance measuring semiconductor circuit according to the first embodiment with the horizontal axis indicating a time and the vertical axis indicating a voltage and the on/off operations.
Figure 6:
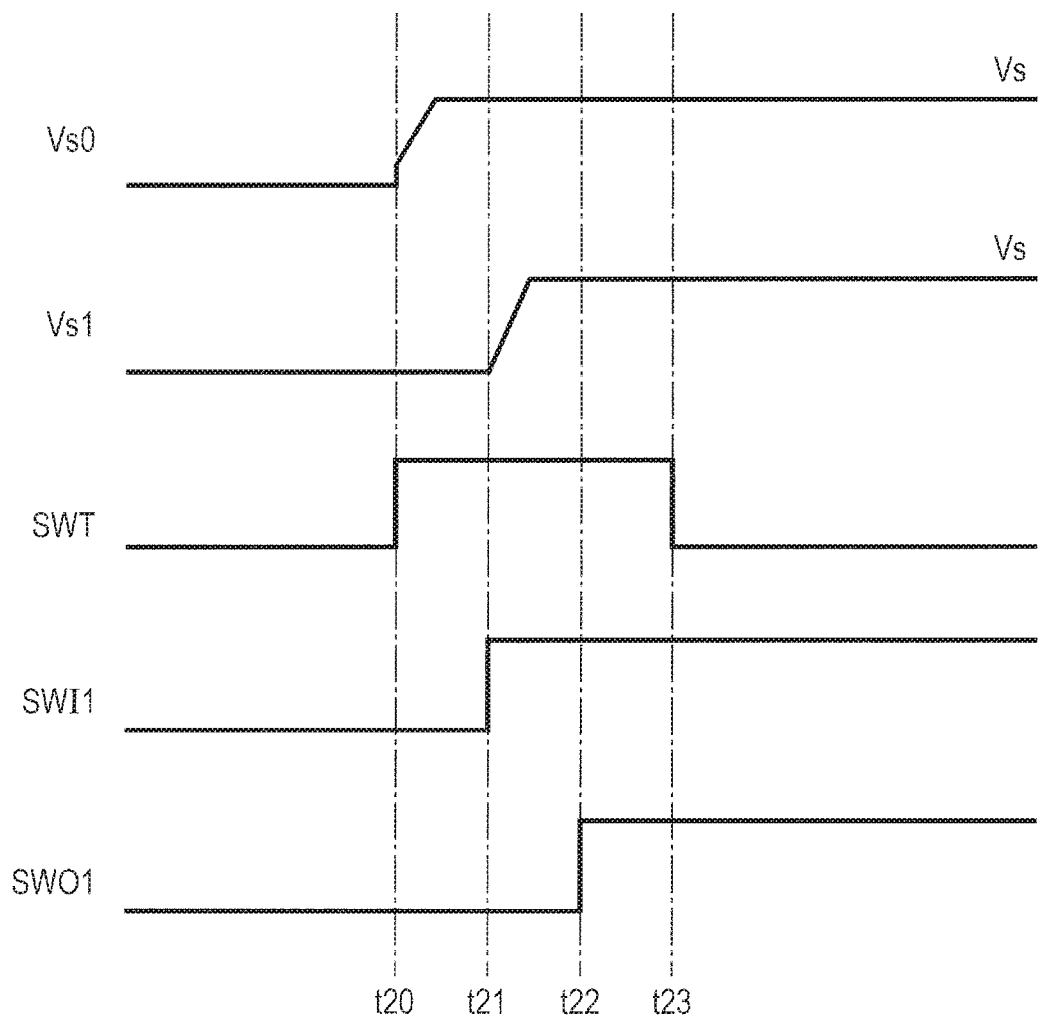
FIG. 6 is a graph showing a voltage between the first input-side switch and the operational amplifier and a voltage between the first input-side switch and the first sensor and the on/off operations of the on-off switch, the first input-side switch, and the first output-side switch in the impedance measuring semiconductor circuit according to the modification of the first embodiment with the horizontal axis indicating a time and the vertical axis indicating a voltage and the on/off operations.

FIGS. 5 and 6 are graphs showing a voltage Vs0 between a first input-side switch SWI1 and the operational amplifier AMP1 and a voltage Vs1 between the first input-side switch SWI1 and a first sensor SE1 and the on/off operations of the on-off switch SWT, the first input-side switch SWI1, and a first output-side switch SWO1 in the impedance measuring semiconductor circuits according to the first embodiment and the modification. The horizontal axis indicates a time and the vertical axis indicates a voltage and the on/off operations.

As shown in FIG. 5, the impedance measuring semiconductor circuit 1 of the first embodiment does not include the on-off switch SWT and thus the operation of the on-off switch SWT is turned off before and after a predetermined time t10.

The first input-side switch SWI1 and the first output-side switch SWO1 are turned off before the time t10. The first input-side switch SWI1 and the first output-side switch SWO1 are turned on at the time t10 in order to apply a set voltage Vs to the first sensor SE1. If the first resistance element R1 has a large resistance, a rising time needs to be extended according to the relationship between a time constant and the impedance of the first sensor SE1. The voltage Vs0 between the first input-side switch SWI1 and the operational amplifier AMP1 and the voltage Vs1 between the first input-side switch SWI1 and the first sensor SE1 both gradually increase from the time t10 and reaches the set voltage Vs at a predetermined time t11. Thus, a rising time increases when the set voltage Vs is applied to the first sensor SE1.

As shown in FIG. 6, in the impedance measuring semiconductor circuit 1a of the modification, the on-off switch SWT is turned off before a predetermined time t20. Then, the on-off switch SWT is turned on at the time t20. This brings the voltage Vs0 between the first input-side switch SWI1 and the operational amplifier AMP1 to the set voltage Vs. At a time t21, the first input-side switch SWI1 is turned on. Thus, the voltage Vs1 between the first input-side switch SWI1 and the first sensor SE1 reaches the set voltage Vs. At a time t22, the first output-side switch SWO1 is turned on. At this point, the voltage Vs0 and the voltage Vs1 have been already set at the set voltage Vs. At a time t23, the on-off switch SWT is turned off.

In the present modification, the on-off switch SWT is tuned on and then the first input-side switch SWI1 and the first output-side switch SWO1 are turned on. Specifically, the on-off switch SWT is turned on, the first input-side switch SWI1 is turned on, and then the first output-side switch SWO1 is turned on.

The rising times of the voltage Vs0 and the voltage Vs1 can be shortened when expression (10) is satisfied as follows:

$$R1+Rswo1 \gg Rswt+Rswi1 \qquad (10)$$

where Rswt, Rswi1, and Rswo1 are the on resistances of the on-off switch SWT, the first input-side switch SWI1, and the first output-side switch SWO1. If the first input-side switch SWI1 and the first output-side switch SWO1 are turned on with the on-off switch SWT turned on, the operational amplifier AMP1 has a low output impedance and thus current fluctuations flow into and out of the operational amplifier and a current does not flow into or out of the sensor, thereby suppressing the influence on the first sensor SE1. The current fluctuations are caused by a switch channel charge (channel charge) or clock feedthrough (clock coupling) when the first input-side switch SWI1 and the first output-side switch SWO1 are turned on.

The relationship between the first sensor SE1 and the on-off switch SWT, the first input-side switch SWI1, and the first output-side switch SWO1 in the above description is also equivalent to the relationship between the second sensor SE2 and the on-off switch SWT, the second input-side switch SWI2, and the second output-side switch SWO2.

Second Embodiment

Figure 7:
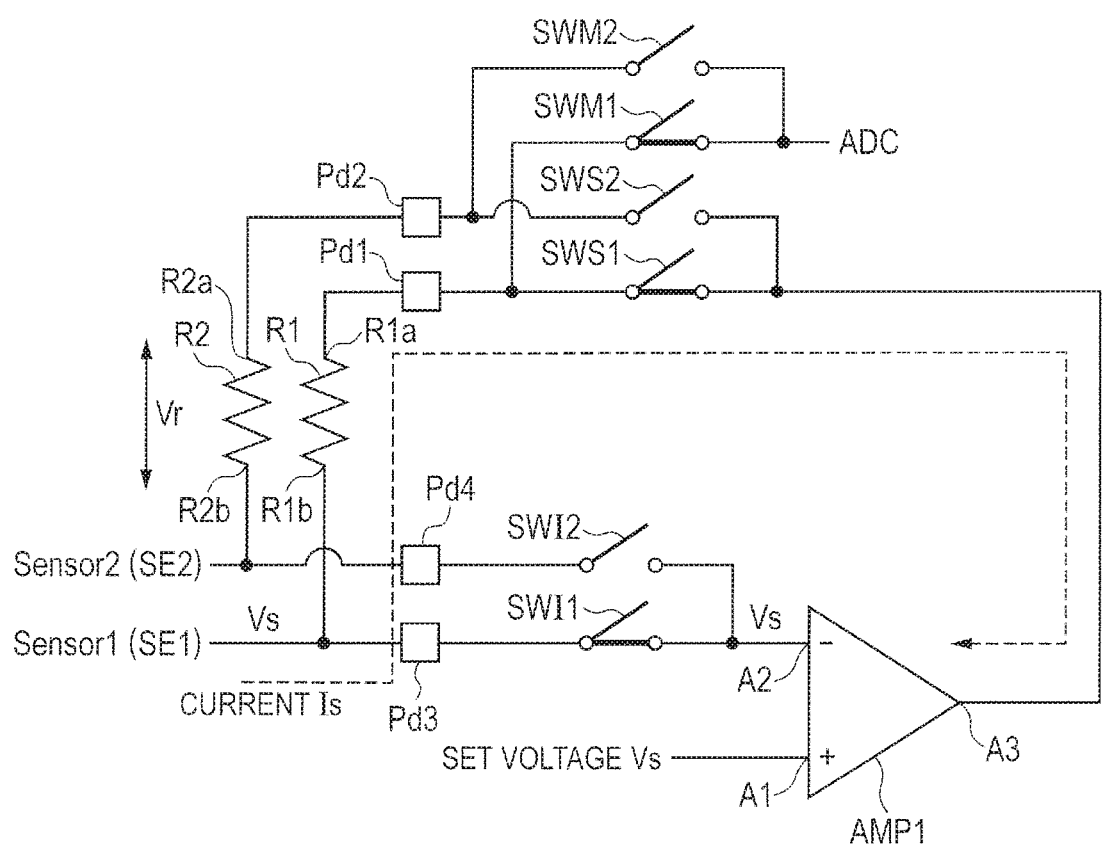
FIG. 7 is a circuit diagram illustrating the configuration of an impedance measuring semiconductor circuit according to a second embodiment.

An impedance measuring semiconductor circuit according to a second embodiment will be described below. FIG. 7 is a circuit diagram illustrating the configuration of the impedance measuring semiconductor circuit 2 according to the second embodiment. As shown in FIG. 7, the impedance measuring semiconductor circuit 2 includes an operational amplifier AMP1, a first resistance element R1, a second resistance element R2, a first input-side switch SWI1, a second input-side switch SWI2, a first selection switch SWS1, a second selection switch SWS2, a first measurement switch SWM1, and a second measurement switch SWM2.

The operational amplifier AMP1 includes a positive input terminal A1, a negative input terminal A2, and an output terminal A3. The positive input terminal A1 receives a predetermined set voltage Vs.

The first resistance element R1 has one end R1a and the other end Rib. One end R1a of the first resistance element R1 is coupled to the output terminal A3 of the operational amplifier AMP1. One end R1a of the first resistance element R1 is coupled to an ADC via the first measurement switch SWM1. The other end R1b of the first resistance element R1 is coupled to the first sensor SE1. A pad Pd1 may be provided between one end R1a of the resistance element R1 and the first selection switch SWS1 and the first measurement switch SWM1.

The second resistance element R2 has one end R2a and the other end R2b. One end R2a of the second resistance element R2 is coupled to the output terminal A3 of the operational amplifier AMP1 via the second selection switch SWS2. The one end R2a of the second resistance element R2 is coupled to the ADC via the second measurement switch SWM1.

The other end R2b of the second resistance element R2 is coupled to a second sensor SE2. The second resistance element R2 has a predetermined resistance value. A voltage Vr between one end R2a and the other end R2b of the second resistance element R2 can be measured according to the value of current passing through the second resistance element R2. A pad Pd2 may be provided between one end R2a of the second resistance element R2 and the second selection switch SWS2 and the second measurement switch SWM2.

The first selection switch SWS1 is coupled between one end R1a of the first resistance element R1 and the output terminal A3 of the operational amplifier AMP1. Specifically, the first selection switch SWS1 is provided between wires coupling one end R1a of the first resistance element R1 and the output terminal A3 of the operational amplifier AMP1. The first selection switch SWS1 is coupled so as to electrically couple or decouple one end R1a of the first resistance element R1 and the output terminal A3 of the operational amplifier AMP1.

The second selection switch SWS2 is coupled between the one end R2a of the second resistance element R2 and the output terminal A3 of the operational amplifier AMP1. Specifically, the second selection switch SWS2 is provided between wires coupling one end R2a of the second resistance element R2 and the output terminal A3 of the operational amplifier AMP1. The second selection switch SWS2 is coupled so as to electrically couple or decouple one end R2a of the second resistance element R2 and the output terminal A3 of the operational amplifier AMP1.

The first measurement switch SWM1 is coupled between the one end R1a of the first resistance element R1 and the ADC. Specifically, the first selection switch SWM1 is provided between wires coupling one end R1a of the first resistance element R1 and the ADC. The first measurement switch SWM1 is coupled so as to electrically couple or decouple one end R1a of the first resistance element R1 and the ADC. The ADC measures the voltages or currents of the first resistance element R1 and the second resistance element R2.

The second measurement switch SWM2 is coupled between one end R2a of the second resistance element R2 and the ADC. Specifically, the second selection switch SWM2 is provided between wires coupling one end R2a of the second resistance element R2 and the ADC. The second measurement switch SWM2 is coupled so as to electrically couple or decouple one end R2a of the second resistance element R2 and the ADC.

The first input-side switch SWI1 is coupled so as to electrically couple or decouple the first sensor SE1 and the negative input terminal A2 of the operational amplifier AMP1. The second input-side switch SWI2 is coupled so as to electrically couple or decouple the second sensor SE2 and the negative input terminal A2 of the operational amplifier AMP1. A pad Pd3 may be provided between the first sensor SE1 and the first input-side switch SWI1. A pad Pd4 may be provided between the second sensor SE2 and the second input-side switch SWI2. Other configurations are similar to those of the first embodiment.

In the present embodiment, when the current of the first sensor SE1 is measured, the first input-side switch SWI1, the first selection switch SWS1, and the first measurement switch SWM1 are turned on and the second input-side switch SWI2, the second selection switch SWS2, and the second measurement switch SWM2 are turned off. Thus, the first sensor SE1 and the second sensor SE2 are isolated by the analog switches. Thus, during measurements with the first sensor SE1 and the second sensor SE2, the influence of the other sensor can be suppressed. At the time of measurement with the second sensor SE2, the switches are reversely turned on and off.

The impedance measuring semiconductor circuit 2 is different from the impedance measuring semiconductor circuit 1 of the first embodiment in that the first resistance element R1 is coupled to the first sensor SE1 and the second resistance element R2 is coupled to the second sensor SE2. The resistance elements for converting a current into a voltage are changed by the sensors so as to change a gain in the conversion to a voltage.

Even if the sensors are used with different current output ranges, an effective signal amplitude range (dynamic range) can be widely obtained at the input of the ADC, thereby improving the accuracy of current measurement using the ADC.

(Modification)

Figure 8:
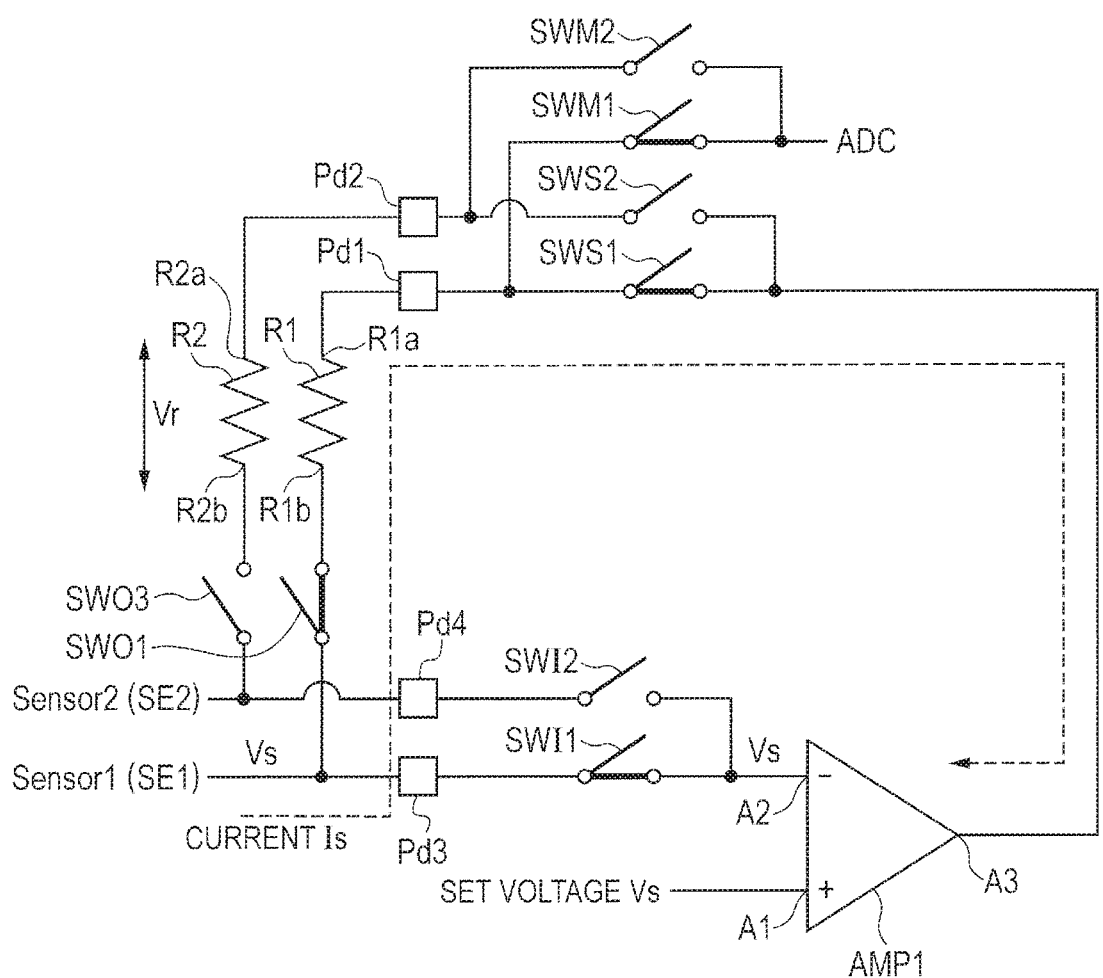
FIG. 8 is a circuit diagram illustrating the configuration of an impedance measuring semiconductor circuit according to a modification of the second embodiment.

A modification of the second embodiment will be described below. An impedance measuring semiconductor circuit 2a according to the modification of the second embodiment further includes a first output-side switch SWO1 coupled to a first sensor SE1 and a third output-side switch SWO3 coupled to a second sensor SE2. The impedance measuring semiconductor circuit may further include a second output-side switch SWO2 (not shown) coupled between the second sensor SE2 and a first resistance element R1 as in the first embodiment. FIG. 8 is a circuit diagram illustrating the configuration of the impedance measuring semiconductor circuit according to the modification of the second embodiment.

As shown in FIG. 8, the impedance measuring semiconductor circuit 2a includes the first output-side switch SWO1 and the third output-side switch SWO3. The first output-side switch SWO1 is coupled between the other end R1b of the first resistance element R1 and the first sensor SE1. Specifically, the first output-side switch SWO1 is provided between wires coupling the other end R1b of the first resistance element R1 and the first sensor SE1. The first output-side switch SWO1 is coupled so as to electrically couple or decouple the other end R1b of the first resistance element R1 and the first sensor SE1.

The third output-side switch SWO3 is coupled between the other end R2b of the second resistance element R2 and the second sensor SE2. Specifically, the third output-side switch SWO3 is provided between wires coupling the other end R2b of the second resistance element R2 and the second sensor SE2. The third output-side switch SWO3 is coupled so as to electrically couple or decouple the other end R2b of the second resistance element R1 and the second sensor SE2.

When the current of the first sensor SE1 is measured, the first output-side switch SWO1, a first input-side switch SWI1, a first selection switch SWS1, and a first measurement switch SWM1 are turned on and the third output-side switch SWO3, a second input-side switch SWI2, a second selection switch SWS2, and a second measurement switch SWM2 are turned off. At the time of measurement with the second sensor SE2, the switches are reversely turned on and off. Other configurations are similar to those of the second embodiment.

The impedance measuring semiconductor circuit 2a of the present modification can also isolate the first sensor SE1 from the first resistance element R1 and isolate the second sensor SE2 from the second resistance element R2. Thus, in measurements with the first sensor SE1 and the second sensor SE2, the influence on the other sensor can be further suppressed. Other effects are included in the descriptions of the first and second embodiments.

Third Embodiment

Figure 9:
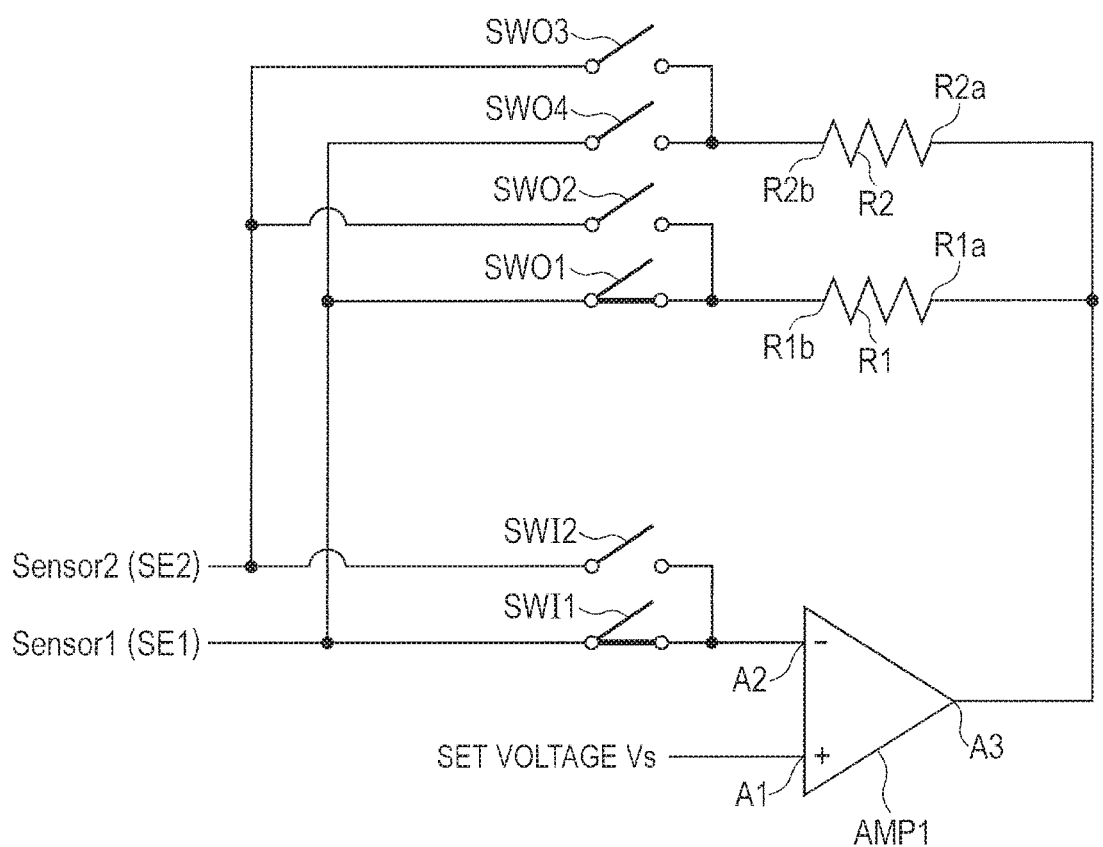
FIG. 9 is a circuit diagram illustrating the configuration of an impedance measuring semiconductor circuit according to a third embodiment.

A third embodiment will be described below. An impedance measuring semiconductor circuit according to the third embodiment includes a plurality of output-side switches such that a resistance element used for measurements of a first sensor SE1 and a second sensor SE2 can be switched to a first resistance element R1 or a second resistance element R1. FIG. 9 is a circuit diagram illustrating the configuration of the impedance measuring semiconductor circuit according to the third embodiment.

As shown in FIG. 9, an impedance measuring semiconductor circuit 3 includes an operational amplifier AMP1, a first resistance element R1, a second resistance element R2, a first input-side switch SWI1, a second input-side switch SWI2, a first output-side switch SWO1, a second output-side switch SWO2, a third output-side switch SWO3, and a fourth output-side switch SWO4. Thus, the second resistance element R2, the third output-side switch SWO3, and the fourth output-side switch SWO4 are added to the configuration of the impedance measuring semiconductor circuit 1 of the first embodiment. The second resistance element R2 is coupled in parallel with the first resistance element R1.

A positive input terminal A1 of the operational amplifier AMP1 receives a predetermined set voltage Vs. One end R1a of the first resistance element R1 and one end R2a of the second resistance element R2 are coupled to an output terminal A3 of the operational amplifier AMP1.

The other end R1b of the first resistance element R1 is coupled to the first sensor SE1 via the first output-side switch SWO1. Moreover, the other end R1b of the first resistance element R1 is coupled to the second sensor SE2 via the second output-side switch SWO2.

One end R2a of the first resistance element R2, which has one end R2a and the other end R2b, is coupled to the output terminal A3 of the operational amplifier AMP1. The other end R2b of the second resistance element R2 is coupled to the second sensor SE2 via the third output-side switch SWO3. The other end R2b of the second resistance element R2 is coupled to the first sensor SE1 via the fourth output-side switch SWO4.

The third output-side switch SWO3 is coupled between the second sensor SE2 and the other end R2b of the second resistance element R2. Specifically, the third output-side switch SWO3 is provided between wires coupling the second sensor SE2 and the other end R2b of the second resistance element R2. The third output-side switch SWO3 is coupled so as to electrically couple or decouple the second sensor SE2 and the other end R2b of the second resistance element R2.

The fourth output-side switch SWO4 is coupled between the first sensor SE1 and the other end R2b of the second resistance element R2. Specifically, the fourth output-side switch SWO4 is provided between wires coupling the first sensor SE1 and the other end R2b of the second resistance element R2. The fourth output-side switch SWO4 is coupled so as to electrically couple or decouple the first sensor SE1 and the other end R2b of the second resistance element R2.

At the time of measurement of the first sensor SE1 with the first resistance element R1, the first output-side switch SWO1 and the first input-side switch SWI1 are turned on and the second output-side switch SWO2, the third output-side switch SWO3, the fourth output-side switch SWO4, and the second input-side switch SWI2 are turned off. At the time of measurement of the first sensor SE1 with the second resistance element R2, the fourth output-side switch SWO4 and the first input-side switch SWI1 are turned on and the first output-side switch SWO1, the second output-side switch SWO2, the third output-side switch SWO3, and the second input-side switch SWI2 are turned off. In this way, the switches are turned on or off such that the used sensors and resistance elements form a feedback loop.

The impedance measuring semiconductor circuit 3 according to the present embodiment can switch a resistance element used for measurements of the first sensor SE1 and the second sensor SE2 to the first resistance element R1 or the second resistance element R1. Even if the sensors are used with different current output ranges, an effective signal amplitude range (dynamic range) can be widely obtained for the input of an ADC, thereby improving the accuracy of current measurement through the ADC. Other effects are included in the descriptions of the first and second embodiments.

(First Modification)

Figure 10:
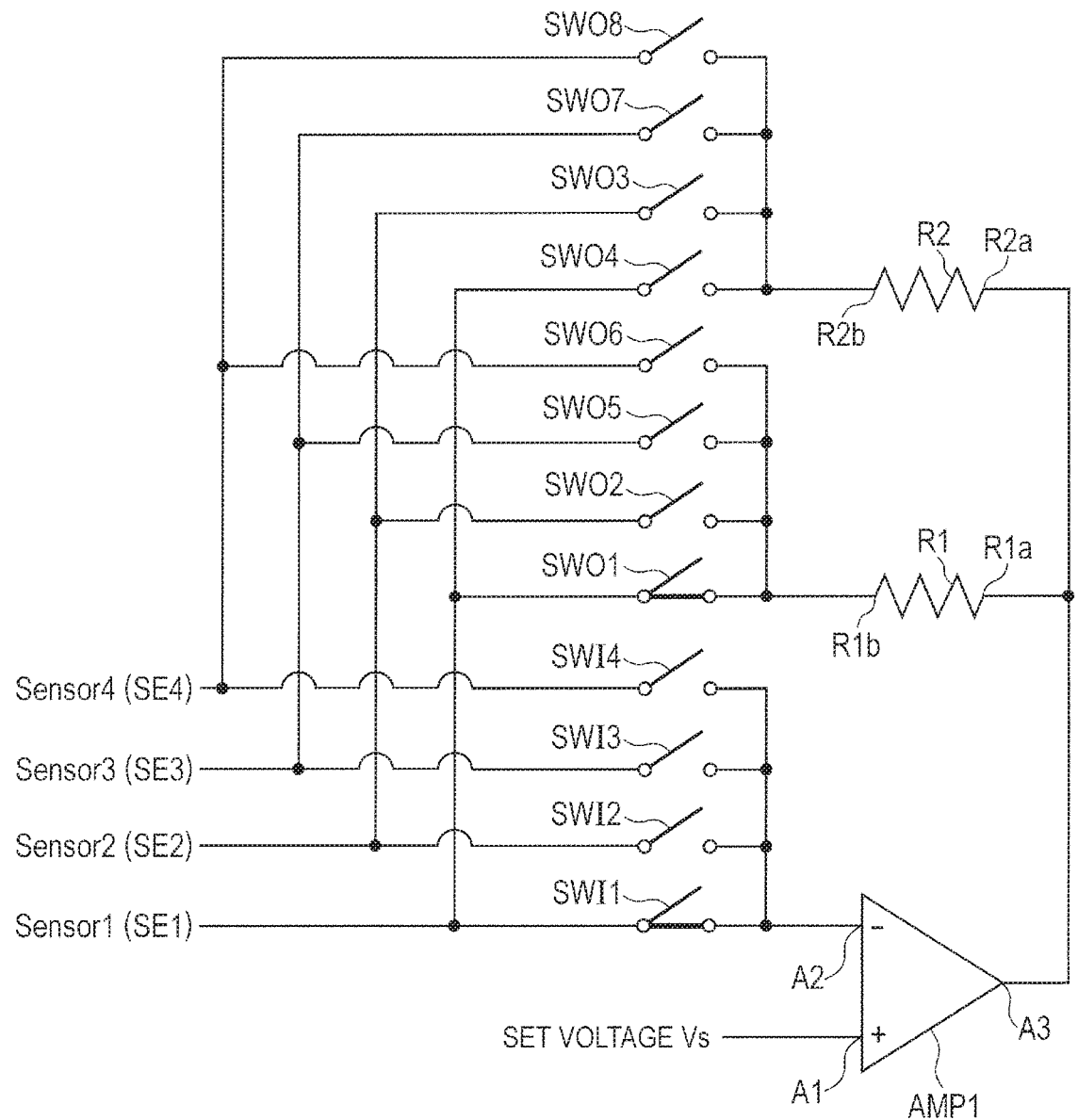
FIG. 10 is a circuit diagram illustrating the configuration of an impedance measuring semiconductor circuit according to a first modification of the third embodiment.

A first modification of the third embodiment will be described below. The present modification is an impedance measuring semiconductor circuit for measurements of a plurality of sensors including first to fourth sensors SE1 to SE4. FIG. 10 is a circuit diagram illustrating the configuration of the impedance measuring semiconductor circuit according to the first modification of the third embodiment.

As shown in FIG. 10, an impedance measuring semiconductor circuit 3a is configured such that a first sensor SE1, a second sensor SE2, a third sensor SE3, and a fourth sensor SE4 are coupled to one another. The third sensor SE3 and the fourth sensor SE4 are added to the configuration of the third embodiment. Accordingly, a third input-side switch SWI3 and a fourth input-side switch SWI4 are added. Furthermore, a fifth output-side switch SWO5, a sixth output-side switch SWO6, a seventh output-side switch SWO7, and an eighth output-side switch SWO8 are added.

The third input-side switch SWI3 is coupled so as to electrically couple or decouple the third sensor SE3 and a negative input terminal A2 of an operational amplifier AMP1. The fourth input-side switch SWI4 is coupled so as to electrically couple or decouple the fourth sensor SE4 and the negative input terminal A2 of the operational amplifier AMP1.

The fifth output-side switch SWO5 is coupled so as to electrically couple or decouple the third sensor SE3 and the other end R1b of a first resistance element R1. The sixth output-side switch SWO6 is coupled so as to electrically couple or decouple the fourth sensor SE4 and the other end R1b of the first resistance element R1. The seventh output-side switch SWO7 is coupled so as to electrically couple or decouple the third sensor SE3 and the other end R2b of a second resistance element R2. The eighth output-side switch SWO8 is coupled so as to electrically couple or decouple the fourth sensor SE4 and the other end R2b of the second resistance element R2.

At the time of measurement of the first sensor SE1 with the first resistance element R1, the first output-side switch SWO1 and the first input-side switch SWI1 are turned on and the second to eighth output-side switches SWO2 to SWO8 and the second to fourth input-side switches SWI2 to SWI4 are turned off. Moreover, the switches are turned on or off such that the used sensors and resistance elements form a feedback loop.

The impedance measuring semiconductor circuit 3a according to the present modification can switch resistance elements used for measurements of the first to fourth sensors SE1 to SE4 to the first resistance element R1 and the second resistance element R2. Other configurations and effects are included in the descriptions of the first to third embodiments.

In the impedance measuring semiconductor circuit 3a of the present modification, the second resistance element R2 may be omitted and the third output-side switch SWO3, the fourth output-side switch SWO4, the seventh output-side switch SWO7, and the eighth output-side switch SWO8 that electrically couple or decouple the second resistance element R2 and the first to fourth sensors SE1 to SE4 may be omitted.

In other words, only the first resistance element R1 may be used for the measurements of the first to fourth sensors SE1 to SE4. In this configuration, at the time of measurement of the first sensor SE1 with the first resistance element R1, the first output-side switch SWO1 and the first input-side switch SWI1 are turned on and the second output-side switch SWO2, the fifth output-side switch SWO5, the sixth output-side switch SWO6, the second input-side switch SWI2, the third input-side switch SWI3, and the fourth input-side switch SWI4 are turned off.

(Second Modification)

Figure 11:
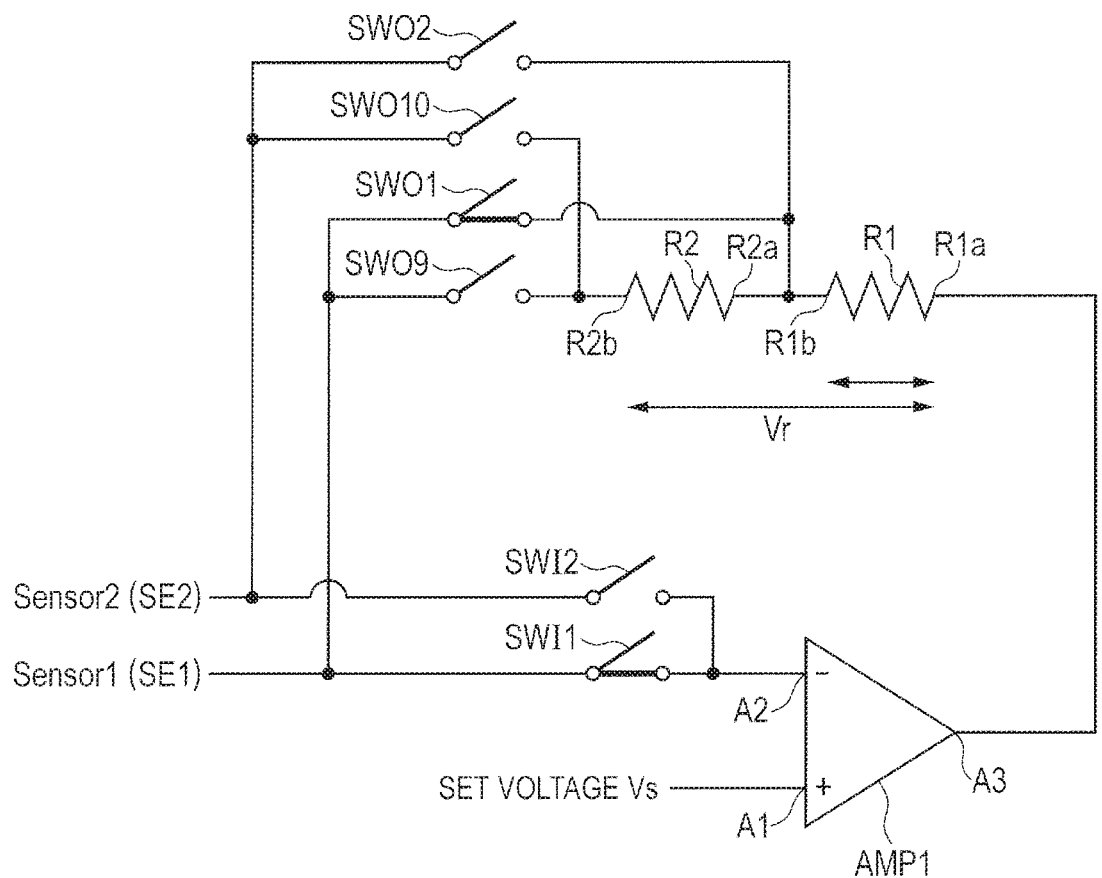
FIG. 11 is a circuit diagram illustrating the configuration of an impedance measuring semiconductor circuit according to a second modification of the third embodiment.

A second modification of the third embodiment will be described below. The present modification is an impedance measuring semiconductor circuit in which a resistance element for converting a current to a voltage can be a first resistance element R1 or a combination of the first resistance element R1 and a second resistance element R2. FIG. 11 is a circuit diagram illustrating the configuration of the impedance measuring semiconductor circuit according to the second modification of the third embodiment.

As shown in FIG. 11, an impedance measuring semiconductor circuit 3b of the present modification includes an operational amplifier AMP1, a first resistance element R1, a second resistance element R2, a first input-side switch SWI1, a second input-side switch SWI2, a first output-side switch SWO1, a second output-side switch SWO2, a ninth output-side switch SWO9, and a tenth output-side switch SWO10. The impedance measuring semiconductor circuit 3b of the present modification is configured such that the second resistance element R2, the ninth output-side switch SWO9, and the tenth output-side switch SWO10 are added to the configuration of the impedance measuring semiconductor circuit 1 of the first embodiment. The second resistance element R2 is coupled in series with the first resistance element R1.

The operational amplifier AMP1 has a positive input terminal A1 that receives a predetermined set voltage Vs. The first resistance element R1 has one end R1a coupled to an output terminal A3 of the operational amplifier AMP1.

The first resistance element R1 has the other end R1b coupled to a first sensor SE1 via the first output-side switch SWO1. Moreover, the other end R1b of the first resistance element R1 is coupled to a second sensor SE2 via the second output-side switch SWO2. The other end R1b of the first resistance element R1 is also coupled to one end R2a of the second resistance element R2. In other words, one end R2a of the second resistance element R2 is coupled to the other end R1b of the first resistance element R1. The second resistance element R2 has the other end R2b coupled to the first sensor SE1 via the ninth output-side switch SWO9. Moreover, the other end R2b of the second resistance element R2 is coupled to the second sensor SE2 via the tenth output-side switch SWO10.

The ninth output-side switch SWO9 is coupled between the first sensor SE1 and the other end R2b of the second resistance element R2. Specifically, the ninth output-side switch SWO9 is provided between wires coupling the first sensor SE1 and the other end R2b of the second resistance element R2. The ninth output-side switch SWO9 is coupled so as to electrically couple or decouple the first sensor SE1 and the other end R2b of the second resistance element R2.

The tenth output-side switch SWO10 is coupled between the second sensor SE2 and the other end R2b of the second resistance element R2. Specifically, the tenth output-side switch SWO10 is provided between wires coupling the second sensor SE2 and the other end R2b of the second resistance element R2. The tenth output-side switch SWO10 is coupled so as to electrically couple or decouple the second sensor SE2 and the other end R2b of the second resistance element R2.

At the time of measurement of the first sensor SE1 with the first resistance element R1, the first output-side switch SWO1 and the first input-side switch SWI1 are turned on and the second output-side switch SWO2, the ninth output-side switch SWO9, the tenth output-side switch SWO10, and the second input-side switch SWI2 are turned off. At the time of measurement of the first sensor SE1 with the combination of the first resistance element R1 and the second resistance element R2, the ninth output-side switch SWO9 and the first input-side switch SWI1 are turned on and the first output-side switch SWO1, the second output-side switch SWO2, the tenth output-side switch SWO10, and the second input-side switch SWI2 are turned off. In this way, the switches are turned on or off such that the used sensors and resistance elements form a feedback loop.

The impedance measuring semiconductor circuit 3b of the present embodiment does not simply switch the first resistance element R1 and the second resistance element R2 but can select a resistance element used for measurement from the first resistance element R1 and the combination of the first resistance element R1 and the second resistance element R2. Thus, the resistance elements can be used for a fine adjustment of a gain in the impedance measuring semiconductor circuit 3b. Other configurations and effects are included in the descriptions of the first to third embodiments.

Fourth Embodiment

Figure 12:
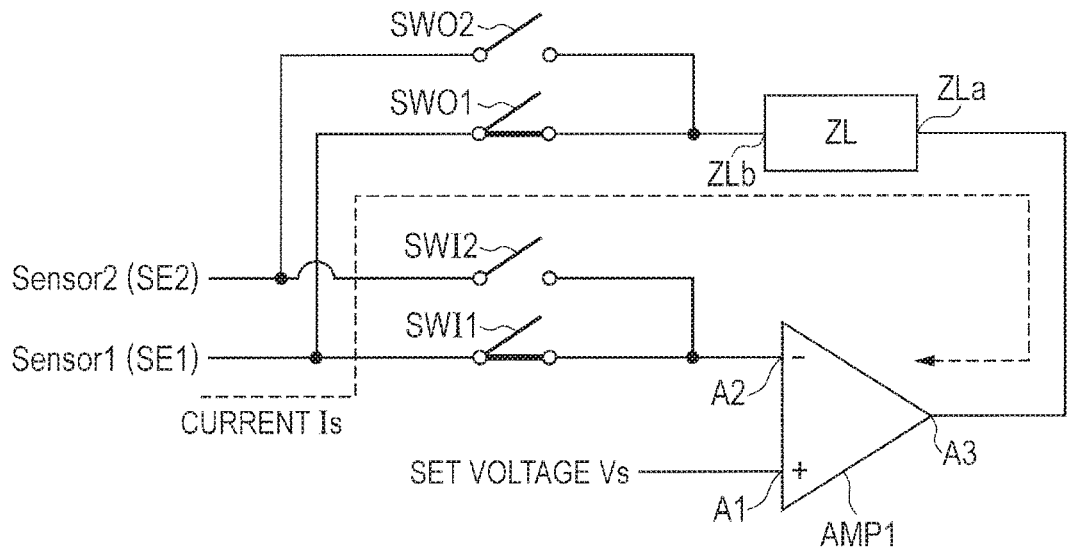
FIG. 12 is a circuit diagram illustrating the configuration of an impedance measuring semiconductor circuit according to a fourth embodiment.

A fourth embodiment will be described below. An impedance measuring semiconductor circuit according to a fourth embodiment has a generalized configuration including a load element ZL as a resistance element. FIG. 12 is a circuit diagram illustrating the configuration of the impedance measuring semiconductor circuit according to the fourth embodiment.

As shown in FIG. 12, an impedance measuring semiconductor circuit 4 includes the load element ZL. In the impedance measuring semiconductor circuit 4, the load element ZL is coupled instead of the first resistance element R1 in the impedance measuring semiconductor circuit 1 of the first embodiment. The load element ZL may include, for example, a capacitor and a switch in addition to a resistance element. The load element ZL is an element indicating an impedance relative to a flowing current and an applied voltage.

The load element ZL has one end ZLa and the other end ZLb. One end ZLa of the load element ZL is coupled to an output terminal A3 of an operational amplifier AMP1. A first output-side switch SWO1 is coupled so as to electrically couple or decouple a first sensor SE1 and the other end ZLb of the load element ZL. A second output-side switch SWO2 is coupled so as to electrically couple or decouple a second sensor SE2 and the other end ZLb of the load element ZL. Other configurations are similar to those of the first embodiment.

Figure 13:
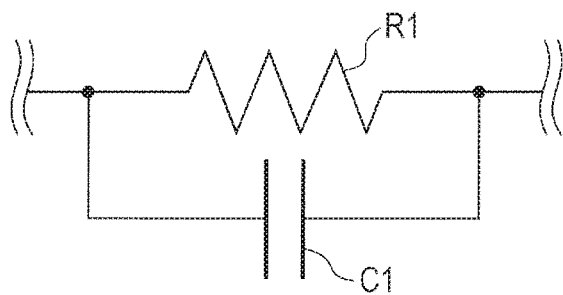
FIG. 13 illustrates a load element of the impedance measuring semiconductor circuit according to the fourth embodiment.

FIG. 13 illustrates the load element ZL of the impedance measuring semiconductor circuit 4 according to the fourth embodiment. As shown in FIG. 13, the load element ZL includes a first resistance element R1 and a capacitive element C1. The capacitive element C1 is coupled in parallel with the first resistance element R1.

The addition of the capacitive element C1 coupled in parallel with the first resistance element R1 can provide a filtering effect that allows the passage of a specific frequency and removes a specific frequency. Moreover, the effect of removing noise such as electromagnetic noise can be obtained. Furthermore, the stability of voltage and current can be improved.

Figure 14:
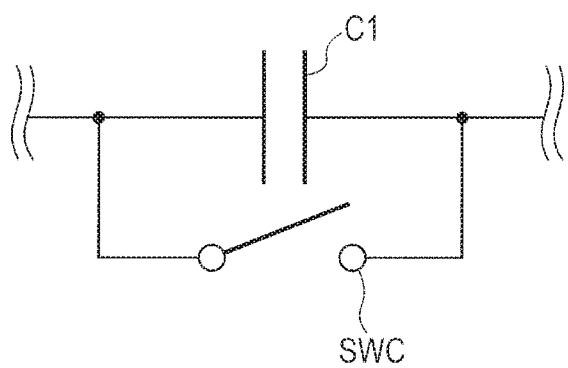
FIG. 14 illustrates another load element of the impedance measuring semiconductor circuit according to the fourth embodiment.

FIG. 14 illustrates another load element ZL of the impedance measuring semiconductor circuit 4 according to the fourth embodiment. As shown in FIG. 14, the load element ZL of the impedance measuring semiconductor circuit 4 includes a capacitive element C1 and an integrating switch SWC coupled in parallel with the capacitive element C1.

According to the present embodiment, a current passing through the circuit can be integrated by the capacitive element C1. The integrated current can be measured after being converted into a voltage.

Fifth Embodiment

Figure 15:
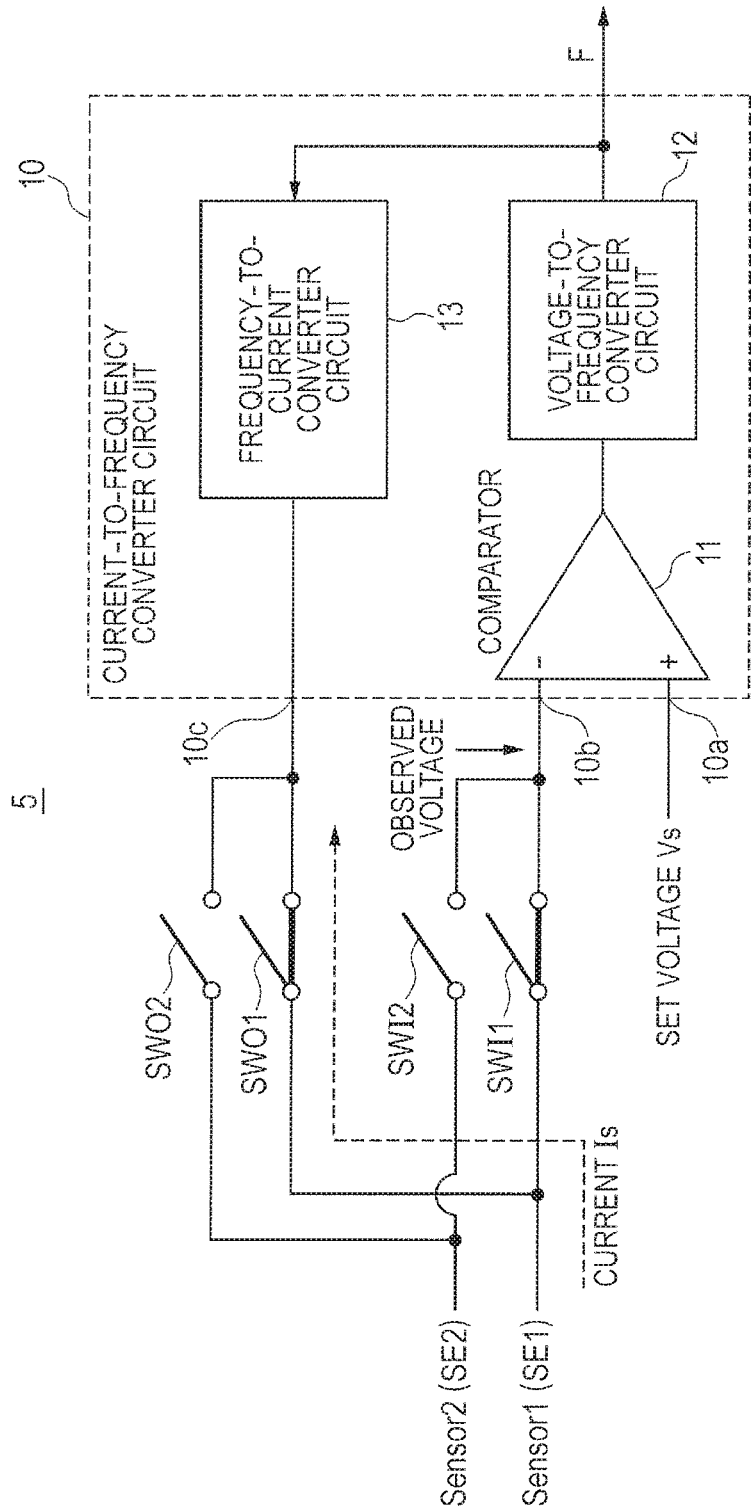
FIG. 15 is a circuit diagram illustrating the configuration of an impedance measuring semiconductor circuit according to a fifth embodiment.

A fifth embodiment will be described below. In an impedance measuring semiconductor circuit according to the present embodiment, a current-to-frequency converter circuit constitutes a negative feedback loop and the impedances of a first sensor and a second sensor are measured. FIG. 15 is a circuit diagram illustrating the configuration of the impedance measuring semiconductor circuit according to the fifth embodiment.

As shown in FIG. 15, an impedance measuring semiconductor circuit 5 according to the present embodiment includes a current-to-frequency converter circuit 10, a first output-side switch SWO1, a second output-side switch SWO2, a first input-side switch SWI1, and a second input-side switch SWI2. The current-to-frequency converter circuit 10 includes a first input terminal 10a, a second input terminal 10b, and an output terminal 10c. The first input terminal 10a receives a predetermined set voltage.

The first output-side switch SWO1 is coupled so as to electrically couple or decouple a first sensor SE1 and the output terminal 10c. The second output-side switch SWO2 is coupled so as to electrically couple or decouple a second sensor SE2 and the output terminal 10c. The first input-side switch SWI1 is coupled so as to electrically couple or decouple the first sensor SE1 and the second input terminal 10b. The second input-side switch SWI2 is coupled so as to electrically couple or decouple the second sensor SE2 and the second input terminal 10b.

The second input terminal 10b receives the observed voltage of the first sensor SE1 through the first input-side switch SWI1. Moreover, the second input terminal 10b receives the observed voltage of the second sensor SE2 through the second input-side switch SWI2.

The current-to-frequency converter circuit 10 includes, for example, a comparator 11, a voltage-to-frequency converter circuit 12, and a frequency-to-current converter circuit 13. The comparator 11 outputs a voltage according to, for example, a difference between signals inputted to the first input terminal 10a and the second input terminal 10b. The voltage-to-frequency converter circuit 12 converts the signal into a pulse signal at a frequency proportionate to the voltage outputted from the comparator 11. For example, the voltage-to-frequency converter circuit 12 is a voltage-controlled oscillator (VCO). The frequency-to-current converter circuit 13 converts the pulse signal into a current.

The current-to-frequency converter circuit 10 may be configured as described in, for example, U.S. Pat. No. 5,917,346. The current-to-frequency converter circuit 10 converts the observed voltage inputted to the second input terminal into a signal having a frequency according to the observed voltage. Then, the converted signal is converted into a current such that the observed voltage is equal to a set voltage Vs. The current-to-frequency converter circuit 10 outputs the converted current from the output terminal. In this way, the current-to-frequency converter circuit 10 forms a negative feedback loop with a current Is outputted such that the observed voltage to be inputted to the negative input terminal reaches the set voltage Vs.

According to the impedance measuring semiconductor circuit 5 of the present embodiment, the negative feedback loop can be formed using the voltage-to-frequency converter circuit 12. This eliminates the need for an operational amplifier AMP1. The impedance measuring semiconductor circuit 5 converts the observed voltage into a frequency. This controls a current such that the observed voltage reaches the set voltage Vs. The conversion into the frequency can increase the range of voltage and current to be controlled. In other words, a dynamic range can be obtained. This can increase a resolution in the measurement of current.

The invention made by the present inventors was specifically described in accordance with the foregoing embodiments. Obviously, the present invention is not limited to the embodiments and various changes can be made within the scope of the invention.

For example, blood glucose monitors provided with the impedance measuring semiconductor circuits according to the foregoing embodiments also fall within the scopes of technical ideas of the embodiments. The effects of the blood glucose monitors are included in the descriptions of the first to fourth embodiments.

The impedance measuring semiconductor circuit of the third embodiment may further include the first selection switch SWS1 coupled so as to electrically couple or decouple one end R1a of the first resistance element R1 and the output terminal A3 of the operational amplifier AMP1, the first measurement switch SWM1 coupled so as to electrically couple or decouple one end R1a of the first resistance element R1 and the ADC, the second selection switch SWS2 coupled to electrically couple or decouple one end R2a of the second resistance element R2 and the output terminal A3 of the op AMP1, and the second measurement switch SWM2 coupled to electrically couple or decouple one end R2a of the second resistance element R2 and the ADC.

At the time of measurement of the first sensor SE1, the first output-side switch SWO1, the first input-side switch SWI1, the first selection switch SWS1, and the first measurement switch SWM1 are turned on and the second output-side switch SWO2, the second input-side switch SWI2, the second selection switch SWS2, and the second measurement switch SWM2 are turned off.

The impedance measuring semiconductor circuit 2a according to the modification of the second embodiment further includes the first output-side switch SWO1 coupled to the first sensor SE1 and the third output-side switch SWO3 coupled to the second sensor SE2. The impedance measuring semiconductor circuit 2a may further include a second output-side switch SWO2 coupled to the second sensor SE2 as in the first embodiment. Specifically, the impedance measuring semiconductor circuit 2a may further include the second output switch SWO2 coupled so as to electrically couple or decouple the other end R1b of the first resistance element R1 and the second sensor SE2, and the fourth output-side switch SWO4 coupled so as to electrically couple or decouple the other end of the second resistance element R2 and the first sensor SE1.

When the current of the first sensor SE1 is measured, the first output-side switch SWO1, the first input-side switch SWI1, the first selection switch SWS1, and the first measurement switch SWM1 are turned on and the second output-side switch SWO2, the third output-side switch SWO3, the fourth output-side switch SWO4, the second input-side switch SWI2, the second selection switch SWS2, and the second measurement switch SWM2 are turned off.

Matters described in the following notes also fall within the scopes of technical ideas of the first to fifth embodiments.

(Note 1)

An impedance measuring semiconductor circuit for measuring the impedances of a first sensor and a second sensor includes a current-to-frequency converter circuit that has a first input terminal, a second input terminal, and an output terminal, the first input terminal receiving a predetermined set voltage, a first output-side switch coupled so as to electrically couple or decouple the first sensor and the output terminal, a second output-side switch coupled so as to electrically couple or decouple the second sensor and the output terminal, a first input-side switch coupled so as to electrically couple or decouple the first sensor and the second input terminal, and a second input-side switch coupled so as to electrically couple or decouple the second sensor and the second input terminal.

(Note 2)

The impedance measuring semiconductor circuit according to note 1, in which the current-to-frequency converter circuit includes a comparator, a voltage-to-frequency converter circuit, and a frequency-to-current converter circuit.

(Note 3)

The impedance measuring semiconductor circuit according to note 1, in which the current-to-frequency converter circuit converts the observed voltage inputted to the second input terminal into a signal having a frequency according to the observed voltage, and the current-to-frequency converter circuit converts the converted signal into a current and outputs the current from the output terminal such that the observed voltage is equal to the set voltage.

(Note 4)

A blood glucose monitor including an impedance measuring semiconductor circuit for measuring the impedances of a first sensor and a second sensor, the impedance measuring semiconductor circuit including a first resistance element having one end and the other end, an operational amplifier that includes a positive input terminal, a negative input terminal, and an output terminal, the positive input terminal receiving a predetermined voltage, the output terminal being coupled to one end of the first resistance element, a first output-side switch coupled so as to electrically couple or decouple the first sensor and the other end of the first resistance element, a second output-side switch coupled so as to electrically couple or decouple the second sensor and the other end of the first resistance element, a first input-side switch coupled so as to electrically couple or decouple the first sensor and the negative input terminal of the operational amplifier, and a second input-side switch coupled so as to electrically couple or decouple the second sensor and the negative input terminal of the operational amplifier.

(Note 5)

The impedance measuring semiconductor circuit according to the first embodiment, the impedance measuring semiconductor circuit for measuring the impedances of a third sensor and a fourth sensor, the impedance measuring semiconductor circuit further including a fifth output-side switch coupled so as to electrically couple or decouple the third sensor and the other end of the first resistance element, a sixth output-side switch coupled so as to electrically couple or decouple the fourth sensor and the other end of the first resistance element, a third input-side switch coupled so as to electrically couple or decouple the third sensor and the negative input terminal, and a fourth input-side switch coupled so as to electrically couple or decouple the fourth sensor and the negative input terminal.

(Note 6)

The impedance measuring semiconductor circuit according to note 5, in which the first output-side switch and the first input-side switch are turned on and the second output-side switch, the fifth output-side switch, the sixth output-side switch, the second input-side switch, the third input-side switch, and the fourth input-side switch are turned off.

(Note 7)

The impedance measuring semiconductor circuit according to the third embodiment further includes a first selection switch coupled so as to electrically couple or decouple one end of the first resistance element and the output terminal, a first measurement switch coupled so as to electrically couple or decouple one end of the first resistance element and an ADC that measures the voltage or current of the first resistance element, a second selection switch coupled so as to electrically couple or decouple one end of the second resistance element and the output terminal, and a second measurement switch coupled so as to electrically couple one end of the second resistance element and the ADC.

(Note 8)

The impedance measuring semiconductor circuit according to note 7, in which the first output-side switch, the first input-side switch, the first selection switch, and the first measurement switch are turned on and the second output-side switch, the third output-side switch, the fourth output-side switch, the second input-side switch, the second selection switch, and the second measurement switch are turned off.

What is claimed is:

1. An impedance measuring semiconductor circuit for measuring impedances of a first sensor and a second sensor, the impedance measuring semiconductor circuit comprising:
a first resistance element having a first end and a second end;
an operational amplifier that includes a positive input terminal, a negative input terminal, and an output terminal, the positive input terminal receiving a predetermined set voltage, the output terminal being coupled to the first end of the first resistance element;
a first output-side switch coupled so as to electrically couple or decouple the first sensor and the second end of the first resistance element;
a second output-side switch coupled so as to electrically couple or decouple the second sensor and the second end of the first resistance element;
a first input-side switch coupled so as to electrically couple or decouple the first sensor and the negative input terminal; and
a second input-side switch coupled so as to electrically couple or decouple the second sensor and the negative input terminal.

2. The impedance measuring semiconductor circuit according to claim 1, wherein the first output-side switch and the first input-side switch are turned on and the second output-side switch and the second input-side switch are turned off.

3. The impedance measuring semiconductor circuit according to claim 1, further comprising an on-off switch coupled so as to electrically couple or decouple the first end of the first resistance element and the negative input terminal.

4. The impedance measuring semiconductor circuit according to claim 3, wherein the first input-side switch and the first output-side switch are turned on after the on-off switch is turned on.

5. The impedance measuring semiconductor circuit according to claim 4, wherein the first output-side switch is turned on after the first input-side switch is turned on.

6. The impedance measuring semiconductor circuit according to claim 1, further comprising:
a second resistance element having a first end and a second end;
a third output-side switch coupled so as to electrically couple or decouple the second sensor and the second end of the second resistance element; and
a fourth output-side switch coupled so as to electrically couple or decouple the first sensor and the second end of the second resistance element,
wherein the first end of the second resistance element is coupled to the output terminal.

7. The impedance measuring semiconductor circuit according to claim 6, wherein the first output-side switch and the first input-side switch are turned on and the second output-side switch, the third output-side switch, the fourth output-side switch, and the second input-side switch are turned off.

8. The impedance measuring semiconductor circuit according to claim 6, wherein the impedance measuring semiconductor circuit also measuring impedances of a third sensor and a fourth sensor, and
wherein the impedance measuring semiconductor circuit further comprising:
a fifth output-side switch coupled so as to electrically couple or decouple the third sensor and the second end of the first resistance element;
a sixth output-side switch coupled so as to electrically couple or decouple the fourth sensor and the second end of the first resistance element;
a seventh output-side switch coupled so as to electrically couple or decouple the third sensor and the second end of the second resistance element;
an eighth output-side switch coupled so as to electrically couple or decouple the fourth sensor and the second end of the second resistance element;
a third input-side switch coupled so as to electrically couple or decouple the third sensor and the negative input terminal; and
a fourth input-side switch coupled so as to electrically couple or decouple the fourth sensor and the negative input terminal.

9. The impedance measuring semiconductor circuit according to claim 8, wherein the first output-side switch and the first input-side switch are turned on and the second output-side switch, the third output-side switch, the fourth output-side switch, the fifth output-side switch, the sixth output-side switch, the seventh output-side switch, the eighth output-side switch, the second input-side switch, the third input-side switch, and the fourth input-side switch are turned off.

10. The impedance measuring semiconductor circuit according to claim 8, further comprising:
a second resistance element having a first end and a second end;
a ninth output-side switch coupled so as to electrically couple or decouple the first sensor and the second end of the second resistance element; and
a tenth output-side switch coupled so as to electrically couple or decouple the second sensor and the second end of the second resistance element,
wherein the first end of the second resistance element is coupled to the second end of the first resistance element.

11. The impedance measuring semiconductor circuit according to claim 10, wherein the first output-side switch and the first input-side switch are turned on and the second output-side switch, the ninth output-side switch, the tenth output-side switch, and the second input-side switch are turned off.

12. The impedance measuring semiconductor circuit according to claim 1, further comprising a capacitive element coupled in parallel with the first resistance element.

13. An impedance measuring semiconductor circuit for measuring impedances of a first sensor and a second sensor, the impedance measuring semiconductor circuit comprising:
a first resistance element having a first end and a second end;
an operational amplifier that includes a positive input terminal, a negative input terminal, and an output terminal, the positive input terminal receiving a predetermined set voltage;
a first selection switch coupled so as to electrically couple or decouple the first end of the first resistance element and the output terminal; and
a first measurement switch coupled so as to electrically couple or decouple the first end of the first resistance element and an ADC that measures a voltage or current of the first resistance element;
a second resistance element having a first end and a second end;
a second selection switch coupled so as to electrically couple or decouple the first end of the second resistance element and the output terminal;

a second measurement switch coupled so as to electrically couple or decouple the first end of the second resistance element and the ADC;

a first input-side switch coupled so as to electrically couple or decouple the first sensor and the negative input terminal; and a second input-side switch coupled so as to electrically couple or decouple the second sensor and the negative input terminal, wherein the second end of the first resistance element is coupled to the first sensor and the second end of the second resistance element is coupled to the second sensor.

14. The impedance measuring semiconductor circuit according to claim 13, wherein the first input-side switch, the first selection switch, and the first measurement switch are turned on and the second input-side switch, the second selection switch, and the second measurement switch are turned off.

15. The impedance measuring semiconductor circuit according to claim 13, further comprising:

a first output-side switch coupled so as to electrically couple or decouple the second end of the first resistance element and the first sensor; and a third output-side switch coupled so as to electrically couple or decouple the second end of the second resistance element and the second sensor.

16. The impedance measuring semiconductor circuit according to claim 15, wherein the first output-side switch, the first input-side switch, the first selection switch, and the first measurement switch are turned on and the third output-side switch, the second input-side switch, the second selection switch, and the second measurement switch are turned off.

17. A semiconductor device comprising:
a first input terminal,
a second input terminal,
a load element having a first end and a second end;
an operational amplifier that includes a positive input terminal, a negative input terminal, and an output terminal, the positive input terminal receiving a predetermined set voltage, the output terminal being coupled to the first end of the load element;
a first switch coupled between the first input terminal and the second end of the load element;
a second switch coupled between the second input terminal and the second end of the load element;
a third switch coupled between the first input terminal and the negative input terminal; and
a fourth switch coupled between the second input terminal and the negative input terminal.

18. The semiconductor device according to claim 17, wherein an impedance of the load element includes a reactance component.

19. The semiconductor device according to claim 18, wherein the first end and the second end of the load element are coupled to a capacitive element.

20. The semiconductor device according to claim 19, wherein the first input terminal is coupled to a first sensor for measuring impedances of a first measuring object, the second input terminal is coupled to a second sensor for measuring impedances of a second measuring object different from the first measuring object.

* * * * *